(12) United States Patent　　(10) Patent No.: US 10,608,139 B1
Michiue　　(45) Date of Patent: Mar. 31, 2020

(54) METHOD OF MANUFACTURING LIGHT EMITTING ELEMENT

(71) Applicant: NICHIA CORPORATION, Anan-shi, Tokushima (JP)

(72) Inventor: Atsuo Michiue, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/658,527

(22) Filed: Oct. 21, 2019

(30) Foreign Application Priority Data

Oct. 23, 2018　(JP) ................................ 2018-199299

(51) Int. Cl.
　　*H01L 33/00*　　(2010.01)
　　*H01L 33/08*　　(2010.01)
　　*H01L 33/24*　　(2010.01)

(52) U.S. Cl.
　　CPC .......... *H01L 33/0075* (2013.01); *H01L 33/08* (2013.01); *H01L 33/24* (2013.01); *H01L 2933/0033* (2013.01); *H01L 2933/0066* (2013.01)

(58) Field of Classification Search
　　CPC ..... H01L 33/0075; H01L 33/08; H01L 33/24; H01L 2933/0033; H01L 2933/66
　　See application file for complete search history.

(56) References Cited

U.S. PATENT DOCUMENTS

| | | | |
|---|---|---|---|
| 2012/0164767 A1 | 6/2012 | Gasse et al. | |
| 2013/0341658 A1* | 12/2013 | Lee | H01L 33/14 257/91 |
| 2014/0117307 A1 | 5/2014 | Herner et al. | |
| 2014/0117401 A1 | 5/2014 | Herner | |
| 2015/0333216 A1 | 11/2015 | Pourquier et al. | |
| 2016/0020358 A1 | 1/2016 | Lee et al. | |
| 2016/0049553 A1* | 2/2016 | Sim | H01L 33/38 257/13 |

(Continued)

FOREIGN PATENT DOCUMENTS

| | | |
|---|---|---|
| JP | 2013-502715 A | 1/2013 |
| JP | 2015-146448 A | 8/2015 |
| JP | 2015-536566 A | 12/2015 |

(Continued)

*Primary Examiner* — Ahmed N Sefer
(74) *Attorney, Agent, or Firm* — Foley & Lardner LLP

(57) ABSTRACT

A method of manufacturing a light-emitting element includes: forming a plurality of rod-shaped layered structures by performing steps including: forming a first conductive-type semiconductor layer on a substrate, forming, on the first conductive-type semiconductor layer, an insulating film defining a plurality of openings and a plurality of rods of a first conductive-type semiconductor, wherein each of the rods is disposed through a respective one of the plurality of openings, forming a light-emitting layer covering outer surfaces of the plurality of rods, and forming a second conductive-type semiconductor layer covering outer surfaces of the light-emitting layer; forming a photoresist pattern covering a portion of the plurality of the rod-shaped layered structures; removing a portion of the insulating film in a region that is not covered by the photoresist pattern; and removing a portion of the plurality of rod-shaped layered structures in the region that is not covered by the photoresist pattern.

14 Claims, 7 Drawing Sheets

(56) References Cited

U.S. PATENT DOCUMENTS

2016/0064609 A1*  3/2016  Cha ........................ H01L 33/24
                                                         257/13

FOREIGN PATENT DOCUMENTS

| JP | 2016-500925 A | 1/2016 |
| JP | 2016-025357 A | 2/2016 |
| JP | 2016-506076 A | 2/2016 |
| JP | 2018-190794 A | 11/2018 |
| WO | WO-2014/096383 A1 | 6/2014 |
| WO | WO-2018/062252 A1 | 4/2018 |

* cited by examiner

METHOD OF MANUFACTURING LIGHT EMITTING ELEMENT

CROSS-REFERENCE TO RELATED PATENT APPLICATION

The present application claims priority under 35 U. S. C. § 119 to Japanese Patent Application No. 2018-199299, filed Oct. 23, 2018, the contents of which are hereby incorporated by reference in their entirety.

BACKGROUND

The present disclosure relates to a method of manufacturing a light emitting element.

Semiconductor light emitting elements including three-dimensional light emitting nanostructures and methods of manufacturing such light emitting elements have been proposed. One example thereof is illustrated in Japanese Patent Publication No. 2016-25357. In the method described in JP 2016-25357A, a base layer 120 is formed on a substrate 101, and a mask layer 130 and a mold layer 135 having a plurality of openings are formed on the base layer 120. A plurality of first conductivity-type semiconductor cores 142 are formed in the plurality of openings. Subsequently, the mold layer 135 is removed, and an active layer 144 and a second conductivity-type semiconductor layer 146 are formed on the first conductivity-type semiconductor cores 142. Accordingly, a plurality of rod-shaped light emitting nanostructures 140 are obtained. Subsequently, a portion of the light emitting nanostructures 140 is removed to form regions, and a second electrode 180 and a first electrode 170 are formed on the regions.

SUMMARY

In some cases, a plurality of rod-shaped light-emitting (nano) structures formed on a single substrate may be divided in several light-emitting regions. In such cases, the rod-shaped light-emitting structures at borders of the regions may be removed.

In a procedure in which a plurality of rod-shaped structures are formed and subsequently a part of the rod-shaped structures is removed to provide a region to dispose an electrode, such an electrode forming region can be determined according to the quality of the rod-shaped structures. For example, defectively formed rod-shaped structures may be removed to provide a region that is used as the electrode forming region. Also, a mask formed with a plurality of openings respectively corresponding to a plurality of rod-shaped structures may be used in such a procedure, in which defective rod-shaped structures may result at openings located at outer peripheral portion of the mask. In order to avoid formation of such defective rod-shaped structures, openings in a mask may be omitted at locations corresponding to an electrode forming region. However, defective rod-shaped structures may still occur near the electrode forming region. In contrast, in a procedure in which a plurality of rod-shaped structures are formed and then a part of plurality of rod-shaped structures is removed to provide an electrode forming region and an electrode is disposed on the electrode forming region, such defective rod-shaped structures can be avoided.

In the procedure described in JP 2016-25357A, a part of the rod-shaped structures is removed while retaining the mask layer provided to form the rod-shaped structures. A portion of the rod-shaped structures may remain in the openings of the mask layer. When a portion of the rod-shaped structures remain in the electrode forming region, upper surfaces and lateral surfaces of the remaining rod-shaped structure and other portions of the surface may differ in quality, which may result in an electrode of film quality different in portions, which may further result in an inferior contact between the semiconductor and the electrode. Removing the remaining portions of the rod-shaped structures requires additional operations, which increases manufacturing time.

An object of certain embodiments described in the present disclosure is to provide a method of manufacturing a light-emitting element, in which rod-shaped structures in an electrode forming surface can be reliably removed.

A method of manufacturing a light-emitting element includes, sequentially: forming a first conductive-type semiconductor layer on a substrate; forming an insulating film defining a plurality of openings and a plurality of rods of a first conductive-type semiconductor on the first conductive-type semiconductor layer, a respective one of the rods being disposed through a respective one of the plurality of openings of the insulating film; forming a light-emitting layer covering outer surfaces of the plurality of rods; forming a second conductive-type semiconductor layer covering outer surfaces of the light-emitting layer, to obtain a plurality of rod-shaped layered structures, a respective one of the plurality of rod-shaped layered structures including the rod, the light-emitting layer, and the second conductive type semiconductor layer; forming a photoresist pattern covering a portion of the plurality of the rod-shaped layered structures; removing a portion of the insulating film in a region that are not covered by the photoresist pattern; and removing a portion of the plurality of rod-shaped layered structures in the region that are not covered by the photoresist pattern.

Using the method of manufacturing according to certain embodiments of the disclosure, rod-shaped layered structures on an electrode forming surface can be reliably removed.

DETAILED DESCRIPTION

Next, embodiments of the present invention will be described in detail with reference to the drawings.

Figure 1:
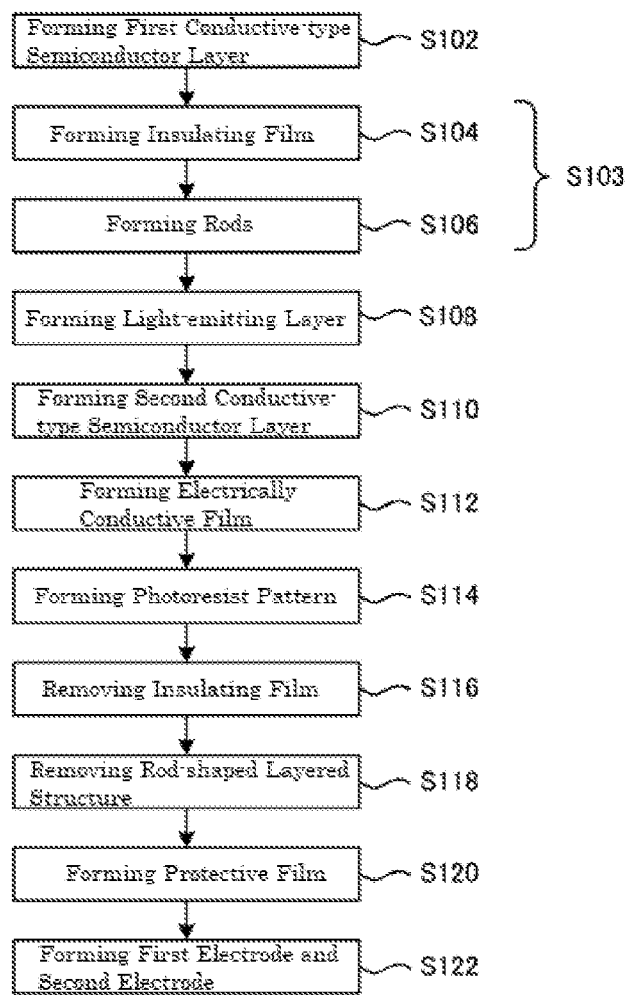
FIG. 1 is a flow chart showing a flow of a method of manufacturing according to one embodiment.

FIG. 1 is a flow chart showing a flow of a method of manufacturing according to one embodiment. A method of manufacturing a light-emitting element according to the present embodiment includes forming a first conductive-type semiconductor layer (S102), forming an insulating film and rods (S103), forming a light-emitting layer (S108), forming a second conductive-type semiconductor layer (S110), forming an electrically conductive film (S112), forming a photoresist pattern (S114), removing the insulating film (S116), removing rod-shaped layered structures (S118), forming a protective film (S120), and forming a first electrode and a second electrode (S122). In the present embodiment, an "n-type" is referred to as a "first conductive-type" and a "p-type is referred to as a "second conductive-type".

Figure 2:
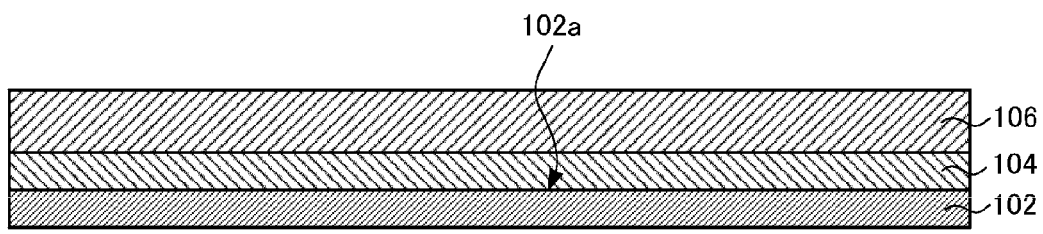
FIG. 2 is a cross-sectional view schematically showing a product at completion of a step of forming a first conductive-type semiconductor layer according to one embodiment.

FIG. 2 is a schematic cross-sectional view illustrating a step of forming a first conductive-type semiconductor layer (S102) according to one embodiment. In the step of forming the first conductive-type semiconductor layer S102, using a main surface 102a that is one of main surfaces of a substrate 102 as a growth surface, a buffer layer 104 is formed on the main surface 102a, and an n-type semiconductor layer 106 is formed on the buffer layer 104. For the substrate 102, for example, a sapphire ($Al_2O_3$) substrate, a SiC substrate, a nitride semiconductor substrate, or the like can be used. For the buffer layer 104, for example, a nitride semiconductor such as GaN or AlN can be used. For the n-type semiconductor layer 106, for example, an n-type nitride semiconductor such as an n-type GaN-based semiconductor can be used. In the present embodiment, an example employing a sapphire substrate as the substrate 102, a GaN layer as the buffer layer 104, and an n-type GaN layer as the n-type semiconductor layer 106 will be illustrated. In the present embodiment, a reaction device such as an MOCVD device can be used to form each semiconductor layer.

The crystal plane of a sapphire substrate with a Miller index (0001) is preferably used as a main surface 102a that is a growth surface. In the present specification, the term "(0001) plane" includes a plane that is slightly inclined to the (0001) plane. More specifically, a surface with an off angle in a range of 0.5° to 2.0° with respect to the (0001) plane is preferably used as the growth surface.

The substrate 102 is preferably pre-treated before forming the buffer layer 104 on the substrate 102. For example, the substrate 102 is heated in the reaction device to heat-treat (thermal cleaning) the main surface 102a. The temperature for the heat treatment can be set in a range of 900 to 1,200° C. and the heating duration can be set in a range of about 2 to 15 minutes. The main surface 102a of the substrate 102 can be purified with this heat treatment.

Subsequently, $NH_3$ gas is supplied in the reaction device and the main surface 102a of the substrate 102 is nitrided. The temperature for the nitriding treatment can be set in a range of 900 to 1,100° C. and the heating duration can be set in a range of 1 to 30 minutes. With such a nitriding treatment, the nitride semiconductor of a (000-1) plane can be grown on the main surface 102a.

Subsequently, a buffer layer 104 is grown on the nitrided main surface 102a of the substrate 102. For example, the buffer layer 104 of GaN can be grown with the temperature of the substrate 102 at 550° C. and the source gases are supplied. The source gas for gallium can be trimethyl gallium (TMG) gas or trimethyl gallium (TEG) gas, and the source gas for nitride can be $NH_3$ gas. The buffer layer 104 can have a thickness of about 20 nm, for example. The buffer layer 104 of amorphous GaN may be grown and subsequently a heat treatment may be applied. It is preferable that the temperature for the heat treatment is set at 1,000° C. or greater and the heating duration is set in a range of about several minutes to about 1 hour, in an atmosphere of nitrogen gas or a mixed gas of nitrogen gas and $NH_3$ gas.

Further, an n-type GaN layer is grown as an n-type semiconductor layer 106 on the buffer layer 104. For the n-type GaN layer, a GaN layer to which Si is added can be employed, for example. The GaN layer to which Si is added can be grown with the source gas described above to which a silane gas is added. The cross-sectional view shown in FIG. 2 schematically illustrates a buffer layer 104 and the n-type semiconductor layer 106 layered in order on the substrate 102. When a substrate such as a GaN substrate that allows growth of the n-type semiconductor layer 106 without the intervening buffer layer 104 is used as the substrate 102, the n-type semiconductor layer 106 may be directly grown on the substrate 102 without providing the buffer layer 104. One or more other layers such as an undoped semiconductor layer may be grown before growing the n-type semiconductor layer 106. As described above, with nitriding the surface of the substrate 102, the n-type semiconductor layer 106 of a (000-1) plane can be grown on the surface (main surface 102a) of the substrate 102.

The step of forming the insulating film and the rods (S103) can further include forming an insulating film (S104) and forming rods (S106).

Figure 3:
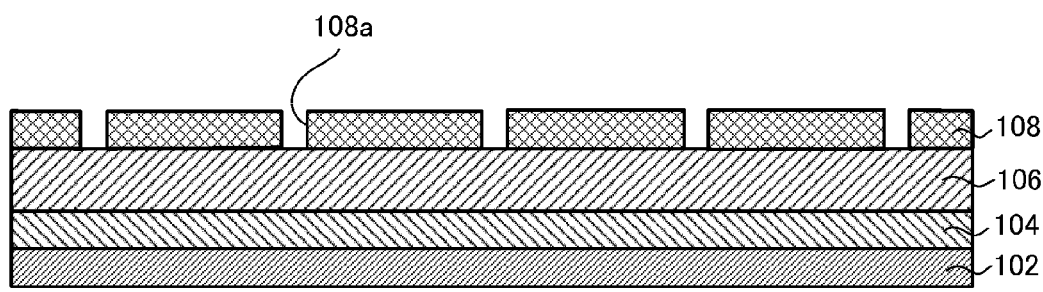
FIG. 3 is a cross-sectional view schematically showing a product at completion of a step of forming an insulating film according to one embodiment.

FIG. 3 is a cross-sectional view schematically showing a product at completion of a step of forming an insulating film (S104). In the step of forming an insulating film (S104), an insulating film 108 defining a plurality of openings 108a is formed on the upper surface that is one of the main surfaces of the n-type semiconductor layer 106. The insulating film 108 serves as a mask in a subsequent operation. For the insulating film 108, a material such as $SiO_2$ or SiN can be used. The insulating film 108 defines a plurality of openings 108a that are through-openings in the thickness direction (up-an up-down direction in FIG. 3) of the insulating film 108. In each of the openings 108a, a part of an upper surface of the n-type semiconductor layer 106 is exposed. The plurality of openings 108a can be formed by using, for example, photolithography.

The openings 108a can be formed in an appropriate shape such as a circular shape, an elliptic shape, or a polygonal shape in a top view. As described later in the specification, when a nitride semiconductor having a wurtzite structure with an upward growth in [000-1] direction (c.f., an upward direction) is grown on the upper surface of the n-type semiconductor layer 106 exposed in each of the openings of the insulating film 108, a semiconductor rod of a hexagonal prism shape with the lateral surfaces of an m-plane is grown.

For this reason, the openings 108a are preferably formed with a shape that can facilitate growth of the hexagonal prisms of the semiconductor rods, which is, more specifically, a circular shape or a regular hexagonal shape in a top view. When each of the openings 108a is formed in a regular hexagonal shape in a top view, highly precise positioning is required to obtain exact matching between the sides of the regular hexagon and the m-plane of the semiconductor rod. Meanwhile, such precise positioning is not needed when each of the openings 108a is formed in a circular shape. With other reasons to be described later in the specification, a circular opening 108a is more preferable.

In the present specification, expressions such as "upper", "lower", and the like used to indicate the directions or locations of components, such as "an upper surface," are used to express relative directional relationships, relative positional relationships, and the like between the components in a drawing that is referred to, and unless specifically indicated, are not intended to show absolute positional relationships. For example, the "upper surface" of the n-type semiconductor layer 106 described above is directed to a main surface of the n-type semiconductor layer 106 that is not in contact with the buffer layer 104, but because the surface faces upward in FIG. 3, is indicated as the "upper surface" for convenience of explanation.

Figure 4:
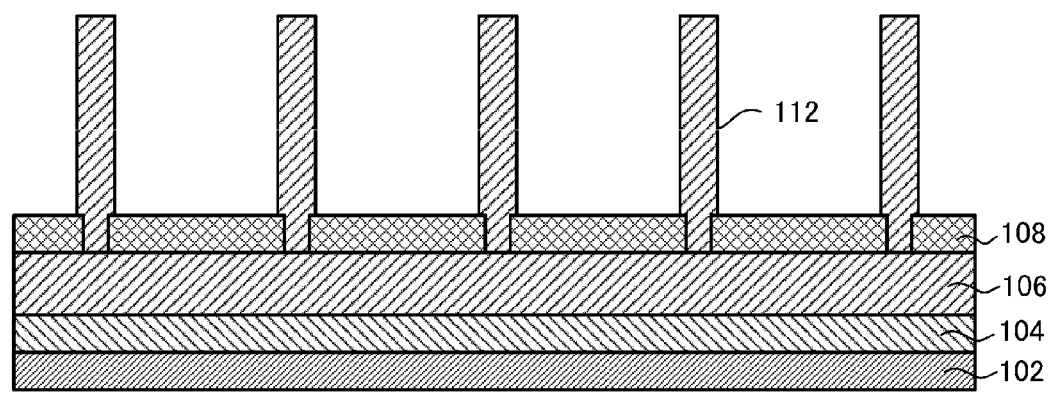
FIG. 4 is a cross-sectional view schematically showing a product at completion of a step of forming rods according to one embodiment.
Figure 5:
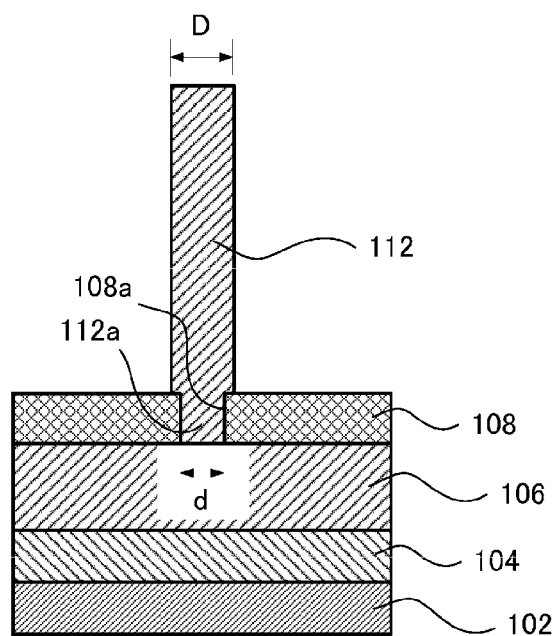
FIG. 5 is a partially enlarged view of FIG. 4.

FIG. 4 is a cross-sectional view schematically showing a product at completion of a step of forming rods (S106). FIG. 5 is a partially enlarged view of FIG. 4. In the step of forming the rods (S106), a plurality of rods 112 of the n-type semiconductor layer (rods of the first conductive-type semiconductor) are formed on respective parts of the upper surface of the n-type semiconductor layer 106 exposed in the plurality of openings 108a of the insulating film 108. The description below illustrates forming of an n-type GaN crystal, the same as the n-type semiconductor layer 106, as each of the rods 112. The rods 112 can be grown by for example, raising the temperature of the substrate 102 in a range of 900 to 1,100° C. and supplying source gases. In this case, similar to that for the n-type semiconductor layer 106, TMG or TEG can be used as the source gas for gallium, $NH_3$ gas can be used as the source gas for nitrogen, and silane gas can be used as the source gas for an n-type dopant. The insulating film 108 prevents growth of the GaN-based semiconductor thereon, such that the GaN crystals grow on the parts of the upper surface of the n-type semiconductor layer 106 exposed in the openings 108a form semiconductor rods respectively extending in upward direction. The height of the rods 112 can be adjusted by a supplying time of the source gases.

When the grown surface is a nitrided surface of the sapphire substrate 102, GaN-based crystals mainly grows in [000-1] direction. Accordingly, the rods 112 are also mainly grown in [000-1] direction of GaN crystals. That is, the rods 112 grow from the n-type semiconductor layer 106 in an upward direction, which is [000-1] direction of the GaN crystals. A GaN-based crystal has a hexagonal system wurtzite type crystal structure. The rods 112 grown in [000-1] direction tend to form hexagonal-columnar shapes. Accordingly, the rods 112 grown through the openings 108a defined in a circular shape tend to form a hexagonal-columnar shape, but not a circular columnar shape. The lateral surfaces of the rods 112 grown into hexagonal-columnar shapes are an m-plane of the GaN-based crystals.

When the openings 108a are defined in a circular shape, the rods 112 grown out through the openings 108a take hexagonal-columnar shapes, such that a transverse dimension D of a respective one of the rods 112 as shown in FIG. 5 becomes greater than the diameter d of its corresponding opening. Accordingly, the base portions 112a of the rods 112 (i.e., portions in the openings 108a) are the narrowest portions in the rods 112. Meanwhile, when the GaN-based semiconductors are grown in [000-1] direction, migration of the GaN-based semiconductors is reduced compared to that grown in [0001] direction, which reduces growth in traverse directions. Accordingly, the rods 112 grow in an upward direction without a significant increase in a traverse dimension. Thus, the rods 112 of relatively uniform traverse dimension (thickness) can be obtained. The greater the diameter of the openings 108a, the thicker the rods 112. Accordingly, the thickness of the rods 112 can be controlled by the diameter of the openings 108a.

Figure 6:
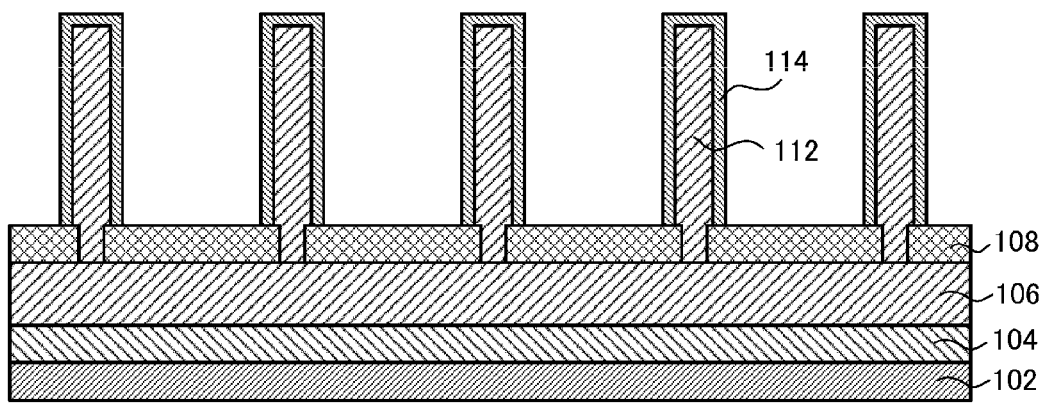
FIG. 6 is a cross-sectional view schematically showing a product at completion of a step of forming a light emitting layer according to one embodiment.

FIG. 6 is a cross-sectional view schematically showing a product at completion of the step of forming a light emitting layer (S108). In the step of forming a light emitting layer (S108), the light emitting layer 114 is formed to cover outer surfaces of a respective one of the rods 112. That is, the light-emitting layer 114 is formed not only on the upper surfaces of the rods 112 but also on the lateral surfaces of the respective one of the rods 112. The light-emitting layer 114 may have a multi-quantum well (MQW) structure. For the light-emitting layer 114, a nitride semiconductor can be used. The light-emitting layer 114 may have a structure in which a plurality of GaN barrier layers and a plurality of InGaN well layers alternately layered. The wavelength of the light emitted from the light-emitting layer 114 can be determined by adjusting forming conditions of the light-emitting layer 114. For example, a light-emitting layer to emit blue light can be formed at a temperature of the substrate 102 in a range of about 800 to 900° C., with supplying source gases. Examples of the source gases include trimethyl gallium (TMG) or triethyl gallium (TEG) as a source gas of gallium, NH3 as a source gas of nitrogen, and trimethyl indium (TMI) as a source gas of indium.

Figure 7:
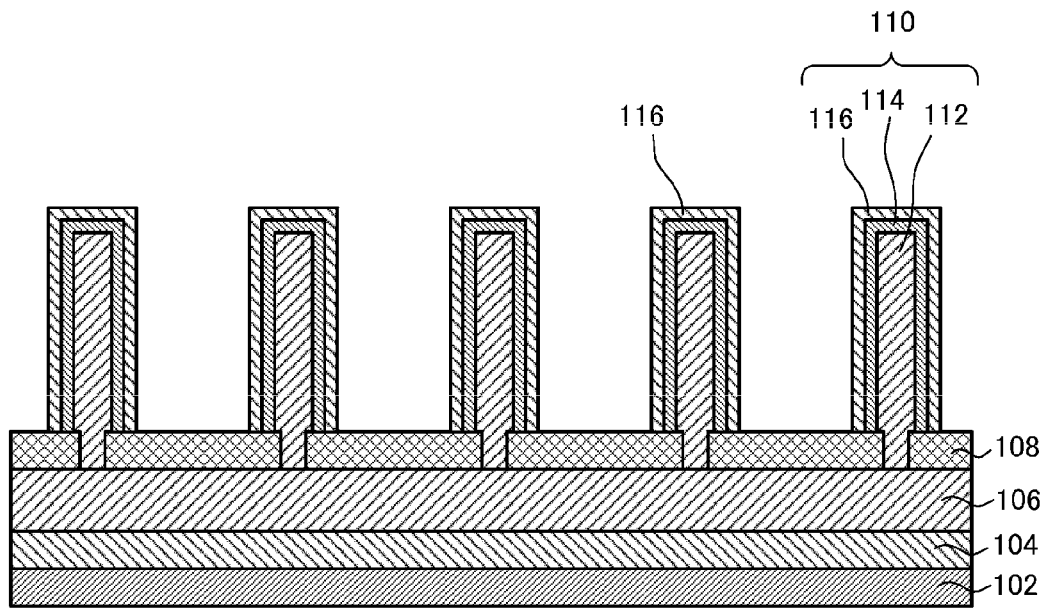
FIG. 7 is a cross-sectional view schematically showing a product at completion of a step of forming a second conductive-type semiconductor layer according to one embodiment.

FIG. 7 is a cross-sectional view schematically showing a product at completion of a step of forming a second conductive-type semiconductor layer (S110) according to one embodiment. In the step of forming the second conductive-type semiconductor layer (S110), a p-type semiconductor layer 116 covering the outer surfaces of the light-emitting layer 114 of a respective one of the rods 112 is formed. The p-type semiconductor layer 116 may be a p-type nitride semiconductor such as a p-type GaN-based semiconductor. The p-type semiconductor layer 116 may be formed by layering a plurality of p-type GaN layers or a plurality of p-type AlGaN layers with different p-type dopant concentrations.

The p-type semiconductor layer 116 can be formed, for example, at a temperature of the substrate 102 in a range of about 800 to 900° C., with supplying source gases. TMG or TEG can be used as a source gas of gallium and $NH_3$ can be used as a source gas of nitrogen. When Mg is used as a p-type dopant, for example, bis(cyclopentadienyl)magnesium (Cp2Mg) can be used as a source gas.

The p-type semiconductor layer 116 is formed as shown in FIG. 7, thus, the rod-shaped layered structures 110, each of which includes the rod 112, the light-emitting layer 114, and the p-type semiconductor layer 116, are formed. The rod-shaped layered structures 110 serve as a light-emitting part of the light-emitting element according to the present embodiment.

When the light-emitting layer 114 and the p-type semiconductor layer 116 are formed on the lateral surfaces of a respective one of the rods 112, the intervals of adjacent rods 112 may affect growth rate of the light-emitting layer 114 and the p-type semiconductor layer 116. The expression "intervals of adjacent rods 112" used in the present specification refers to a distance between the centers of two adjacent openings 108a defined in the insulating film 108 (illustrated in FIG. 3) in a plan view. An expression "intervals of adjacent rod-shaped layered structures 110" refers to similar configuration. When the plurality of rods 112 are formed at substantially uniform intervals, the light-emitting layer 114 and the p-type semiconductor layer 116 can be grown respectively at a substantially uniform growth rate. For example, in the step of forming an insulating film (S104) (illustrated in FIG. 3), the openings 108a can be defined in a right triangular grid in a plan view, which allows formation of the rods 112 at substantially uniform intervals in the step of forming rods (S106). Further, a direction through the centers of the openings 108a in a plan view is preferably in parallel to the m-axis direction of the GaN-based crystals that form the rods 112, that is, preferably in parallel to the a-axis of the sapphire substrate 102. With this arrangement, the rods 112 having a hexagonal pyramid shape formed in a right triangular grid are adjacent one other with lateral surfaces facing substantially in parallel to each other. In this case, each of the light-emitting layer 114 and the p-type semiconductor layer 116 can be formed at a substantially uniform growth rate on the lateral surfaces of each of the rods 112, which allows for forming each of the light-emitting layer 114 and the p-type semiconductor layer 116 with a substantially uniform thickness.

The distance between each two adjacent rods 112 (i.e., intervals of rods 112) affects the indium incorporation into the InGaN well layer of the light emitting layer 114. When the InGaN well layer is formed with a supply of a source gas for In at a constant flow rate, the greater the distance between each two adjacent rods 112, the greater amount of In incorporated into the InGaN well layer. The higher the content of In in the InGaN well layer, the longer wavelength side the wavelength of light emitted from the InGaN well layer. Accordingly, the rod-shaped layered structures 110 configured to emit light of different wavelengths can be formed by adjusting the distance between each two adjacent rods 112. For example, providing a group of rods 112 formed with greater intervals, a group of rods 112 formed with smaller intervals, and a group of rods 112 formed with intermediate intervals on a single substrate 102 allows for three regions of the rod-shaped layered structures, each configured to emit red light, green light, and blue light, respectively, formed on a single substrate 102.

For example, by adjusting a thickness of each of the rod-shaped layered structures 110 in a direction parallel to the main surface of the n-type semiconductor layer 106 (on which the rod-shaped layered structures 110 are formed) within a range of 50 nm to 10 μm, and adjusting a distance between each two adjacent rod-shaped layered structures 110 within a range of 75 nm to 200 μm, the rod-shaped layered structures 110 configured to emit light of a desired wavelength can be obtained. The expression "thickness of rod-shaped layered structure 110" refers to a maximum dimension of a width of cross section of the rod-shaped layered structure 110. The expression "average thickness" refers to an average value of the thickness of ten rod-shaped layered structures 110 that are adjacent to one other. Each of two adjacent rod-shaped layered structures 110 are spaced apart from each other such that an electrically conductive film 120, which will be described later in the specification, can be formed on the outer surfaces of the rod-shaped layered structures 110. More specifically, the shortest distance between the outer surfaces of the adjacent rod-shaped layered structures 110 can be adjusted within a range of 25 nm to 190 μm. The rod-shaped layered structures 110 can have a height within a range of 1 to 100 μm.

Figure 8:
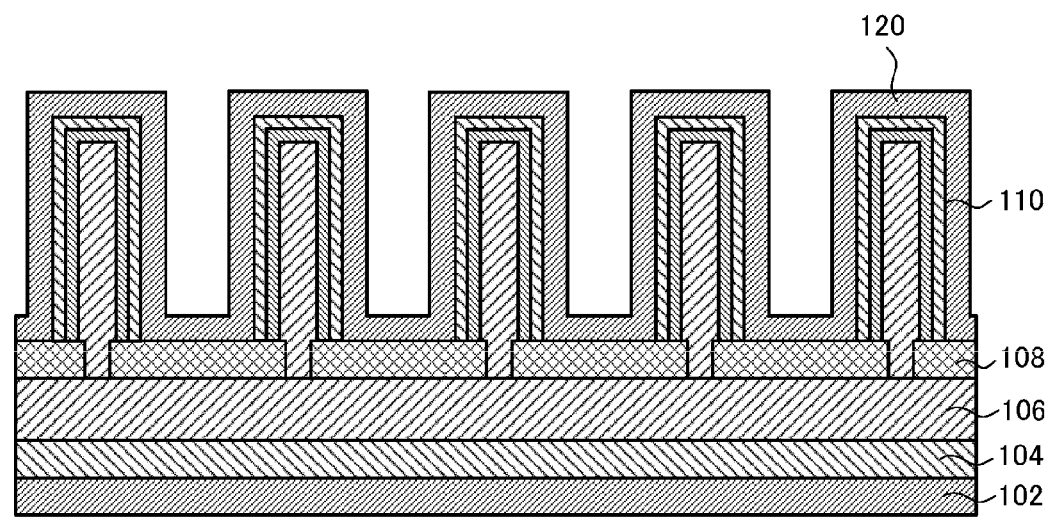
FIG. 8 is a cross-sectional view schematically showing a product at completion of a step of forming an electrically conductive film according to one embodiment.

FIG. 8 is a cross-sectional view schematically showing a product at completion of a step S112 of forming an electrically conductive film (S112). In the step S112, an electrically conductive film 120 covering a plurality of rod-shaped layered structures 110 is formed. Examples of the electrically conductive film 120 include an electrically conductive oxide film made of such as indium tin oxide (ITO), indium zinc oxide (IZO), ZnO, or InGaZnO$_4$, and Ag film. The electrically conductive film 120 may be a single film or a multilayered film.

The description below illustrates forming of an ITO film as the electrically conductive film 120. In a configuration in which light is extracted upward, it is advantageous that a material transmissive to light emitted to the rod-shaped layered structures 110, such as an ITO, is used for the electrically conductive film 120. For example, the electrically conductive film 120 is formed by way of sputtering, without using a resist pattern. Accordingly, as shown in FIG. 8, the electrically conductive film 120 covers not only the outer surfaces of the rod-shaped layered structures 110 but also continuously covers the upper surface of the insulating film 108. When the p-type semiconductor layer 116 is a p-type nitride semiconductor layer, electric resistance is relatively higher than that of an n-type nitride semiconductor layer, such that the entire outer surfaces of the rod-shaped layered structures 110 are preferably covered by the electrically conductive film 120. With this arrangement, the electric current can be supplied to the entire portions of the p-type semiconductor layer 116 that forms the outer surfaces of the rod-shaped layered structures 110, which allows emission of light from the entire outer surfaces of the rod-shaped layered structures 110.

Therefore, it is preferable to form the electrically conductive film 120 before the step of forming a photoresist pattern (S114). With this arrangement, the p-type semiconductor layer 116 can be protected against a developing solvent required to remove the photoresist pattern in a later step. In particular, when the p-type semiconductor layer 116 is a p-type nitride semiconductor layer, the concentration of the p-type dopant is generally high, which leads to a reduction in the quality of crystallinity, which causes the p-type semiconductor layer 116 to be susceptible to be etched by the developing solvent. By forming the electrically conductive film 120 that covers the p-type semiconductor layer 116, before performing the step S114 of forming photoresist pattern, the p-type semiconductor layer 116 can be protected by the electrically conductive film 120 in the step S114.

Figure 9:
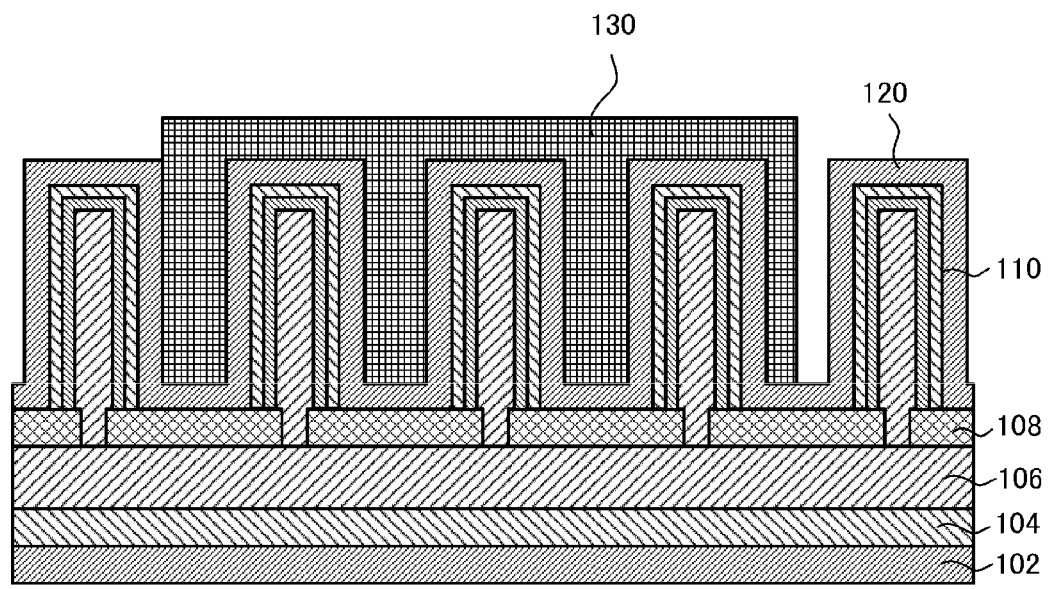
FIG. 9 is a cross-sectional view schematically showing a product at completion of a step of forming a photoresist pattern according to one embodiment.

FIG. 9 is a cross-sectional view schematically showing a product at completion of a step of forming a photoresist pattern: S114 according to one embodiment. In the step of forming a photoresist pattern (S114), a photoresist pattern 130 covering a portion of the plurality of rod-shaped layered structures 110 is formed. The photoresist pattern 130 includes first portions exposing a first portion of the plurality of rod-shaped layered structures 110 that are to be removed in the step of removing rod-shaped layered structures (S118), and second portions covering a second portion of the plurality of rod-shaped layered structures 110. The first portion of the plurality of rod-shaped layered structures 110 to be removed in the step of removing rod-shaped layered structures (S118) is located in a region where an electrode to be formed, and the second portion of the plurality of rod-shaped layered structures 110 covered by the photoresist pattern 130 is configured to function as a light-emitting region of the light-emitting element.

Figure 10:
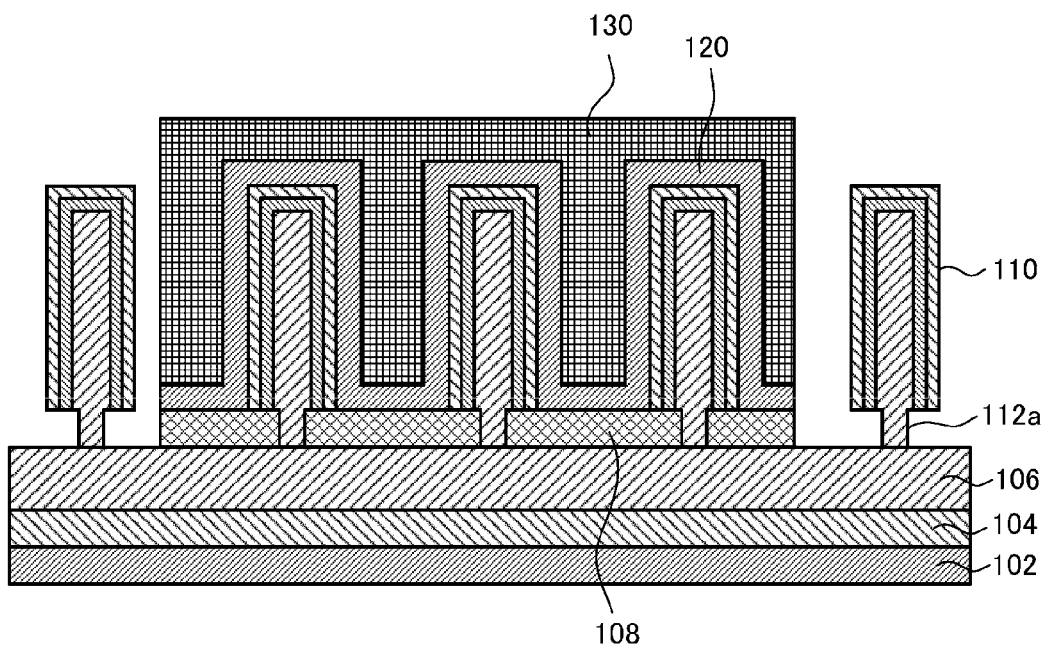
FIG. 10 is a cross-sectional view schematically showing a product at completion of a step of removing an insulating film according to one embodiment.

FIG. 10 is a cross-sectional view schematically showing a product at completion of a step of removing the insulating film (S116). In the step of removing the insulating film (S116), the electrically conductive film 120 and the insulating film 108 in the region that is not covered by the photoresist pattern 130 are removed by etching. As shown in FIG. 10, the narrow base portions 112a of the rod-shaped layered structures 110 are exposed by removing the insulating film 108.

Figure 11:
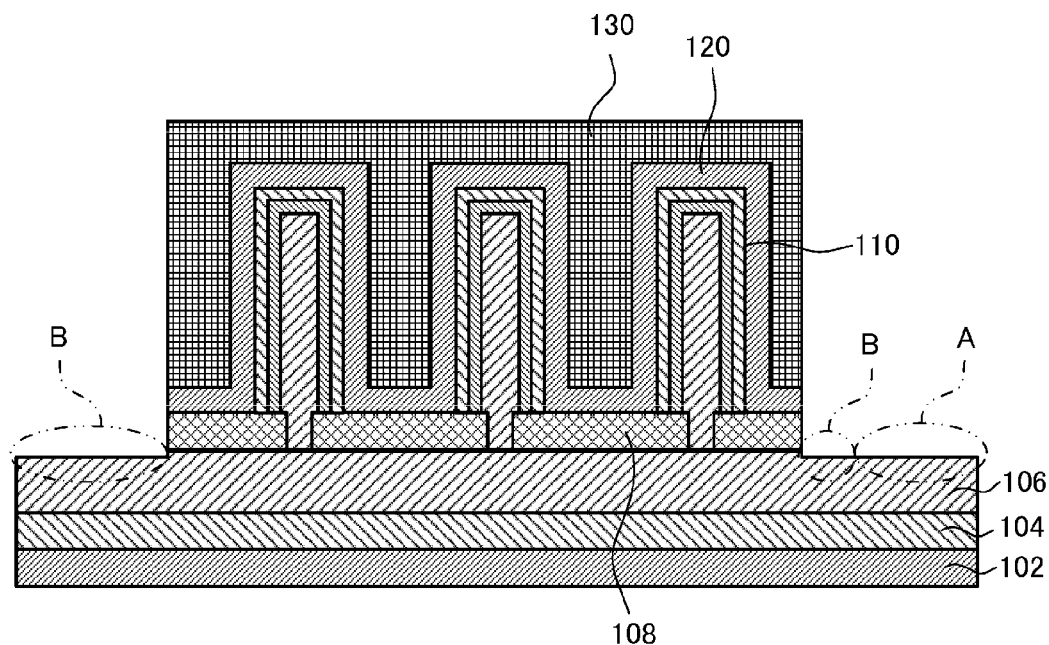
FIG. 11 is a cross-sectional view schematically showing a product at completion of a step of removing rod-shaped layered structures according to one embodiment.

FIG. 11 is a cross-sectional view schematically showing a product at completion of a step of removing rod-shaped layered structures: S118. In the step of removing rod-shaped layered structures (S118), the first portion of the plurality of rod-shaped layered structures 110 that is not covered by the photoresist pattern 130 is removed. For example, the plurality of rod-shaped layered structures 110 can be mechanically removed by using ultrasonic waves in water. In the present embodiment, the insulating film 108 is removed prior to removing the rod-shaped layered structures 110, which exposes the narrow base portions 112a of the rod-shaped layered structures 110, which facilitates removing of the rod-shaped layered structures 110. Accordingly, the rod-shaped layered structures 110 can be more thoroughly removed at their base portions, compared to a conventional method in which the rod-shaped layered structures are removed before removing the insulating film. Further, according to the method as in the present embodiment, in which the rods 112 are grown through openings of the insulating film 108, the base portion of a respective one of the rods 112 that is in the opening and surrounded by the insulating film 108 is narrower compared to the portion grown above the opening. Accordingly, removing the insulating film 108 to expose the narrow base portions, and then removing the rod-shaped layered structures 110, can reduce time required to remove the rod-shaped layered structures 110.

In the method of removing the rod-shaped layered structures 110, wet etching may be performed and then the rod-shaped layered structures 110 may be removed by using ultrasonic waves. When the rods 112 have a hexagonal prism shape with the lateral surfaces of the m-plane, the lateral surfaces are not easily wet-etched. However, forming the openings 108a in a circular shape allows for forming of the base portions 112a in a columnar shape, which can be easily wet-etched. Wet-etching further narrows the base portions 112a in a columnar shape, and subsequent apply of ultrasonic waves can further reduce time required to remove the rod-shaped layered structures 110. Wet etching can be performed, for example, by using tetramethylammonium hydroxide (TMAH). In the present embodiment, the narrow base portions 112a of the rod-shaped layered structures 110 are exposed, allowing a reduction in time required for removing the rod-shaped layered structures 110 even by using wet etching, compared to that by using a conventional method.

Further, when the first conductive-type semiconductor layer is the first-conductive-type nitride semiconductor layer and the upper surface is a (000-1) plane, it can be easily etched by using an etching solution such as TMAH for wet etching, compared to etching a (0001) plane. A long-time etching of a (000-1) plane may result in a rough surface, which may result in an inferior contact with the electrode. For this reason, when the first conductive-type semiconductor layer is the first conductive-type nitride semiconductor layer and the upper surface is a (000-1) plane, it is preferable not to use wet etching for removing the rod-shaped layered structures 110, or to use wet etching in combination with ultrasonic treatment.

As described above, according to the present embodiment, the rod-shaped layered structures 110 can be entirely removed respectively down to the bottom of the base portion. Nevertheless, removing the rod-shaped layered structures 110 may cause some irregularities on the surface of the n-type semiconductor layer 106. When higher degree of flatness is required on the surface of the n-type semiconductor layer 106 after removing the rod-shaped layered structures 110, the surface of the n-type semiconductor layer 106 may be subjected to etching to increase flatness. For this purpose, for example, a reactive ion etching (RIE) may be used. FIG. 11 is a cross-sectional view schematically showing a state in which flatness of the upper surface of the n-type semiconductor layer 106 has been improved by etching. Removing the rod-shaped layered structures 110 produces rod-free regions on the upper surface of the n-type semiconductor layer 106, which includes a first region indicated by "A" and a second region indicated by "B", as shown in FIG. 11.

Figure 12:
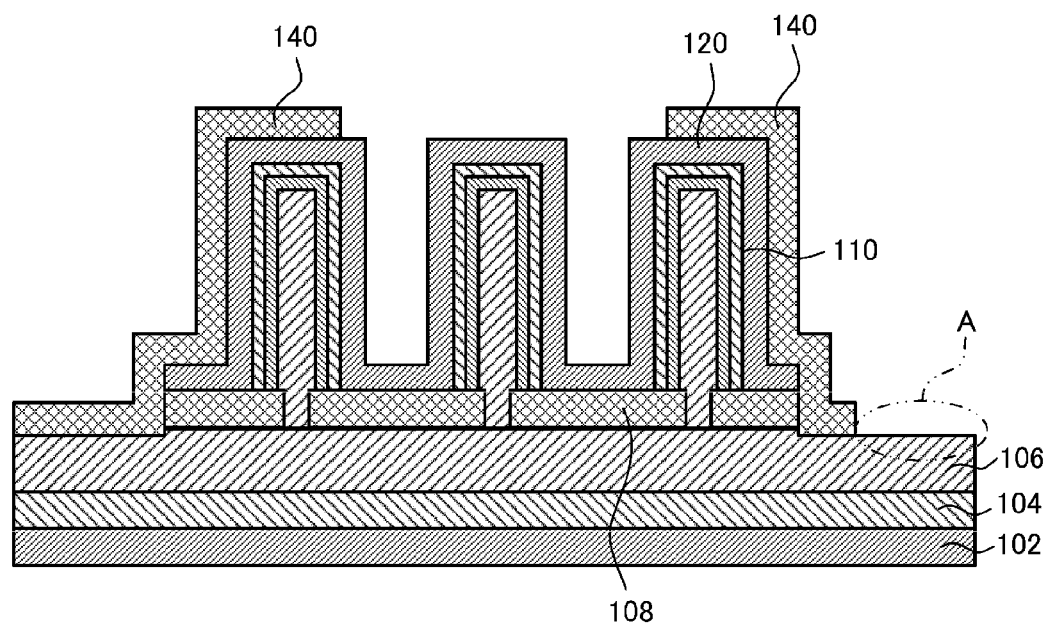
FIG. 12 is a cross-sectional view schematically showing a product at completion of a step of forming a protective film according to one embodiment.

FIG. 12 is a cross-sectional view schematically showing a product at completion of a step of forming a protective film (S120). In the step of forming a protective film (S120), the resist pattern 130 is removed, and an insulating protective film 140 is formed on exposed portions of the upper surface of the n-type semiconductor layer 106 in the second region B, continuously onto a portion of the remaining plurality of rod-shaped layered structures 110. In the present embodiment, the electrically conductive film 120 is formed on the outer surfaces of a respective one of the plurality of rod-shaped layered structures 110, such that substantially the insulating protective film 140 is formed on the portions of the upper surface of the n-type semiconductor layer 106 exposed in the second region B, and continuously on portions of the electrically conductive film 120 covering the outer surfaces of a portion of the plurality of rod-shaped layered structures 110.

The protective film 140 can be formed with an insulating member that is transmissive to light emitted from the rod-shaped layered structures 110, for example, $SiO_2$, SiN, $Al_2O_3$, or the like, can be used. As described above, the insulating protective film 140 is preferably formed on the portion of the upper surface of the n-type semiconductor layer 106 exposed adjacent to the remaining plurality of rod-shaped layered structures 110, and continuously on portions of the outer surfaces of the electrically conductive film 120 covering the rod-shaped layered structures 110 located adjacent to the region B. Accordingly, the possibility of occurrence of short circuit between the n-type semiconductor layer 106 and the electrically conductive film 120, caused by adhesion of dust or the like, may be reduced.

Figure 13:
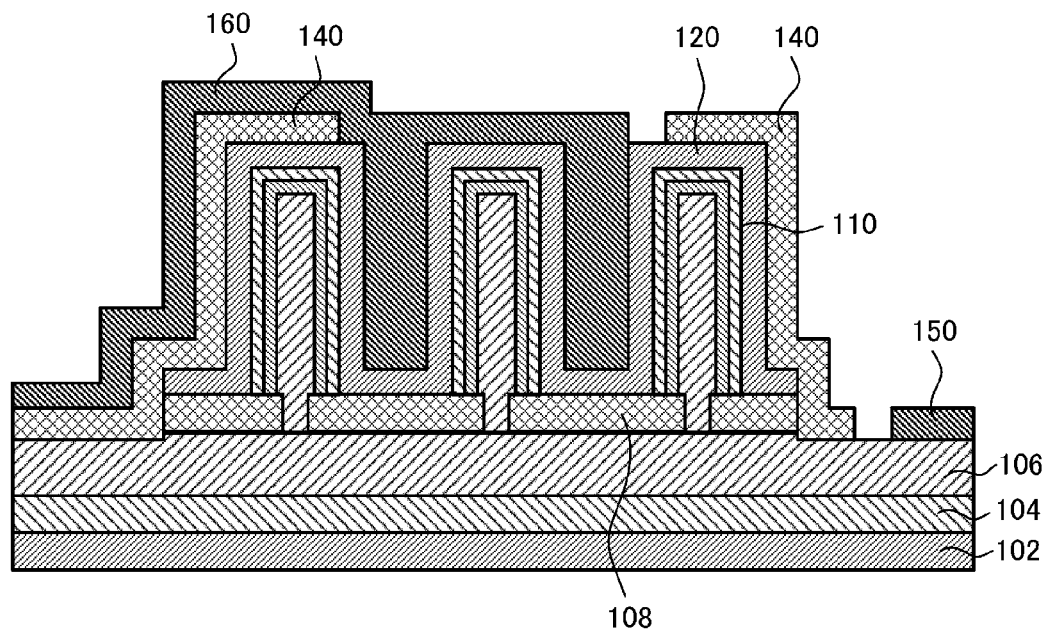
FIG. 13 is a cross-sectional view schematically showing a product at completion of a step of forming a first electrode and a second electrode according to one embodiment.

FIG. 13 is a cross-sectional view schematically showing a product at completion of a step of forming a first electrode and a second electrode (S122) according to one embodiment. In the step of forming a first electrode and a second electrode (S122), a first electrode 150 electrically connected to the n-type semiconductor layer 106 is formed on the upper surface of the n-type semiconductor layer 106 exposed in the first region A, and a second electrode 160 electrically connected to the p-type semiconductor layer 116 and also extended onto a portion of the outer surface of the protective film 140 in the second region B is formed. The expression "electrically connected to the p-type semiconductor layer 116" used above also refers to a case in which electrical connection to the p-type semiconductor layer 116 is through the electrically conductive film 120, when the electrically conductive film 120 is provided.

Examples of suitable materials of the first electrode 150 and the second electrode 160 include a single metal such as Ag, Al, Ni, Rh, Au, Cu, Ti, Pt, Pd, Mo, Cr and W, and an alloy whose main component is one or more of those metals. For example, an electrode material layer can be formed by sequentially layering Ti and Au. The first electrode 150 and the second electrode 160 can be discretely formed, but it is preferable to form the first electrode 150 and the second electrode 160 simultaneously using the same material, which allows a reduction in manufacturing time.

The first electrode 150 and the second electrode 160 can be formed, for example, as described below. A resist pattern defining openings at predetermined locations for the first electrode 150 and the second electrode 160 is formed, then, using a vapor deposition method, a sputtering method, or the like, an electrode material layer for the first electrode 150 and the second electrode 160 is formed. Alternatively, a resist pattern defining an opening at a predetermined location for the first electrode 150 and the second electrode 160 may be formed. Subsequently, through lift-off, the resist pattern and the electrode material layer formed on the resist pattern are removed. Thus, as shown in FIG. 13, the first electrode 150 and the second electrode 160 are formed to complete the light emitting element.

As described above, in the present embodiment, the insulating film 108 is removed before removing the rod-shaped layered structures 110. Accordingly, the base portions 112*a* of the rod-shaped layered structures 110 are exposed, which facilitates removing of the rod-shaped layered structures 110. This allows for more thorough removal of the rod-shaped layered structures 110 respectively at the root of the base portion, and accordingly, the rod-shaped layered structures 110 can be removed more completely, compared to the use of a conventional method in which the insulating film is removed after removing the rod-shaped layered structures 110.

While embodiments of the present invention have been described, the technical scope of the present invention is not limited thereto. It will be apparent to those of ordinary skill in the art that various modifications and improvements may be applied to the embodiments described above, without departing from the technical scope of the present invention. All such modifications and improvements apparent to those skilled in the art are deemed to be within the scope of the disclosure as defined by the appended claims. For example, in the embodiments described above, "n-type" is indicated as "first conductive-type" and "p-type" is indicated as "second conductive-type", but vice-versa, "p-type" may be indicated as "first conductive-type" and "n-type" may be indicated as "second conductive-type". When a semiconductor material having a relatively low resistivity is used for the p-type semiconductor layer 116, or when emission from the entire of the rod-shaped layered structures 110 is not required, the electrically conductive film 120 is not necessary. In the embodiments described above, the rods are formed after forming the insulating film, but the rods may be formed before forming the insulating film. For example, it may be such that growing the n-type semiconductor layer and disposing a mask of a plurality of dots on the surface of the n-type semiconductor layer, then etching is performed to create a plurality of rods corresponding to the mask, which exposes the n-type semiconductor layer around the rods, then, an insulating film is formed on the n-type semiconductor layer exposed around the rods.

Although the embodiments have been described in detail above for ease of understanding of the present invention, the present invention is not necessarily limited to one that has all the configurations described above. One or more components of the embodiments can be replaced by other components or can be omitted.

What is claimed is:

1. A method of manufacturing a light-emitting element comprising:
   forming a plurality of rod-shaped layered structures by performing steps comprising:
      forming a first conductive-type semiconductor layer on a substrate,
      forming, on the first conductive-type semiconductor layer, an insulating film defining a plurality of openings and a plurality of rods of a first conductive-type semiconductor, wherein each of the rods is disposed through a respective one of the plurality of openings,
      forming a light-emitting layer covering outer surfaces of the plurality of rods, and
      forming a second conductive-type semiconductor layer covering outer surfaces of the light-emitting layer,
      wherein each of the formed rod-shaped layered structures comprises one of the rods, a portion of the light-emitting layer, and a portion of the second conductive-type semiconductor layer;
   forming a photoresist pattern covering a portion of the plurality of the rod-shaped layered structures;
   removing a portion of the insulating film in a region that is not covered by the photoresist pattern; and
   removing a portion of the plurality of rod-shaped layered structures in the region that is not covered by the photoresist pattern.

2. The method of manufacturing a light-emitting element according to claim 1, wherein:
   forming the insulating layer and the plurality of rods comprises:
      forming the insulating film defining the plurality of openings on a surface of the first conductive-type semiconductor layer, and
      forming the plurality of rods on portions of the surface of the first conductive-type semiconductor layer exposed through the plurality of openings.

3. The method of manufacturing a light-emitting element according to claim 1, further comprising:
   after the forming the second conductive-type semiconductor layer and before the forming the photoresist pattern, forming an electrically conductive film covering the plurality of rod-shaped layered structures; and
   while removing the portions of the insulating film, also removing portions of the electrically conductive film in the region that is not covered by the photoresist pattern.

4. The method of manufacturing a light-emitting element according to claim 3, wherein:
   the electrically conductive film is an ITO film.

5. The method of manufacturing a light-emitting element according to claim 1, wherein:
   removing the portion of the plurality of rod-shaped layered structures produces rod-free regions exposing the first conductive-type semiconductor layer and including a first region and a second region; and
   the method further comprises:
      forming an insulating protective film on the second region through an upper portion of the rod-shaped layered structures adjacent to the second region, and
      forming a first electrode and a second electrode, the first electrode being disposed on the first region and being electrically connected to the first conductive-type semiconductor layer exposed on the first region, and the second electrode being disposed on a portion of the protective film on a portion of the second region and electrically connected to the second conductive-type semiconductor layer of the rod-shaped layered structures, and the first electrode and the second electrode being insulated from each other.

6. The method of manufacturing a light-emitting element according to claim 1, wherein:
   each of the plurality of openings defined in the insulating film is formed in a circular shape in a top view.

7. The method of manufacturing a light-emitting element according to claim 1, wherein:
   in forming the first conductive-type semiconductor layer, the first conductive-type semiconductor layer is a first conductive-type nitride-based semiconductor layer having an upper surface of a (000-1) plane.

8. The method of manufacturing a light-emitting element according to claim 1, wherein:
   in removing the portion of the plurality of rod-shaped layered structures, the rod-shaped layered structures are removed by using ultrasonic waves, or by using wet etching, or by using wet etching and subsequently using ultrasonic waves.

9. The method of manufacturing a light-emitting element according to claim 1, wherein:
   the first conductive-type semiconductor layer is an n-type semiconductor layer, and the second conductive-type semiconductor layer is a p-type semiconductor layer.

10. The method of manufacturing a light-emitting element according to claim 9, wherein:
    the n-type semiconductor layer is an n-type GaN-based semiconductor layer.

11. The method of manufacturing a light-emitting element according to claim 9, wherein:
    the p-type semiconductor layer is a p-type GaN-based semiconductor layer.

12. The method of manufacturing a light-emitting element according to claim 1, wherein:
    the insulating film is an $SiO_2$ film or an SiN film.

13. The method of manufacturing a light-emitting element according to claim 1, wherein:
    each of the rod-shaped layered structures has a thickness in a direction parallel to an upper surface of the first conductive-type semiconductor layer within a range of 50 nm to 10 µm.

14. The method of manufacturing a light-emitting element according to claim 13, wherein:
    a distance between each two adjacent rod-shaped layered structures is within a range of 75 nm to 200 µm.

* * * * *